United States Patent
Hsu et al.

(10) Patent No.: US 11,855,668 B2
(45) Date of Patent: Dec. 26, 2023

(54) 10BASE-T TRANSMITTER USING WAVEFORM SHAPING FOR APPLYING PRE-COMPENSATION OF INTER-SYMBOL INTERFERENCE AND ASSOCIATED METHOD

(71) Applicant: Airoha Technology Corp., Hsinchu (TW)

(72) Inventors: Chia-Hsing Hsu, New Taipei (TW); Wei-Ling Li, Chiayi County (TW)

(73) Assignee: Airoha Technology Corp., Hsinchu (TW)

( * ) Notice: Subject to any disclaimer, the term of this patent is extended or adjusted under 35 U.S.C. 154(b) by 0 days.

(21) Appl. No.: 17/963,175

(22) Filed: Oct. 10, 2022

(65) Prior Publication Data
US 2023/0378983 A1 Nov. 23, 2023

Related U.S. Application Data

(60) Provisional application No. 63/343,554, filed on May 19, 2022.

(51) Int. Cl.
*H04B 1/04* (2006.01)
*H03M 1/06* (2006.01)

(52) U.S. Cl.
CPC ........ *H04B 1/0475* (2013.01); *H03M 1/0617* (2013.01)

(58) Field of Classification Search
CPC ........................ H04B 10/25137; H04B 1/0475; H04B 15/02; H04B 3/32; H03M 1/0617
USPC .................................................. 375/295–297
See application file for complete search history.

(56) References Cited

U.S. PATENT DOCUMENTS

| | | | | |
|---|---|---|---|---|
| 4,715,064 A | * | 12/1987 | Claessen | H04B 3/03 370/290 |
| 4,799,059 A | * | 1/1989 | Grindahl | G08C 25/00 340/10.2 |
| 5,267,269 A | * | 11/1993 | Shih | H04L 25/4904 375/296 |
| 5,798,661 A | * | 8/1998 | Runaldue | G06F 1/022 327/107 |
| 5,995,555 A | * | 11/1999 | Young | H04L 25/49 332/107 |
| 6,075,452 A | * | 6/2000 | Tsuchihashi | H02J 13/00 340/870.18 |
| 6,154,784 A | * | 11/2000 | Liu | G06F 13/4072 327/563 |
| 9,214,953 B1 | * | 12/2015 | Mengad | H03M 3/50 |
| 9,312,959 B2 | * | 4/2016 | Abe | H04B 10/25137 |

(Continued)

FOREIGN PATENT DOCUMENTS

WO 2018/104929 A1 6/2018

*Primary Examiner* — Emmanuel Bayard
(74) *Attorney, Agent, or Firm* — Winston Hsu

(57) ABSTRACT

A 10BASE-T transmitter includes a Manchester encoder circuit, a waveform shaper circuit, and digital-to-analog converter (DAC) circuit. The Manchester encoder circuit applies Manchester encoding to an input data to generate an encoded data. The waveform shaper circuit converts the encoded data into a plurality of digital codes. The DAC circuit generates a transmit (TX) waveform according to the plurality of digital codes. The waveform shaper circuit controls a portion of the plurality of digital codes for applying pre-compensation of inter-symbol interference (ISI) to the TX waveform.

20 Claims, 8 Drawing Sheets

(56) References Cited

U.S. PATENT DOCUMENTS

| | | |
|---|---|---|
| 9,571,308 B1 | 2/2017 | Lugthart |
| 10,484,046 B1 | 11/2019 | McClellan |
| 10,938,404 B1* | 3/2021 | Sanchez ................. H03M 1/66 |
| 2002/0135914 A1* | 9/2002 | Stein ........................ G11B 5/09 |
| 2004/0005015 A1* | 1/2004 | Chan ................... H04L 25/0286 |
| | | 375/295 |
| 2009/0161785 A1* | 6/2009 | Nakamura .............. H04L 27/04 |
| | | 375/282 |
| 2009/0225899 A1* | 9/2009 | Dent ................. H04L 25/03343 |
| | | 375/296 |
| 2016/0065394 A1 | 3/2016 | Sindalovsky |
| 2021/0266205 A1 | 8/2021 | Michaeli |
| 2021/0350237 A1 | 11/2021 | Litichever |

\* cited by examiner

10BASE-T TRANSMITTER USING WAVEFORM SHAPING FOR APPLYING PRE-COMPENSATION OF INTER-SYMBOL INTERFERENCE AND ASSOCIATED METHOD

CROSS REFERENCE TO RELATED APPLICATIONS

This application claims the benefit of U.S. Provisional Application No. 63/343,554, filed on May 19, 2022. The content of the application is incorporated herein by reference.

BACKGROUND OF THE INVENTION

1. Field of the Invention

The present invention relates to long length 10BASE-T transmission, and more particularly, to a 10BASE-T transmitter using wave shaping for applying pre-compensation of inter-symbol interference (ISI) and an associated method.

2. Description of the Prior Art

The current 10BASE-T physical layer (PHY) is designed according to Institute of Electrical and Electronics Engineers (IEEE) 802.3 standard. Specifically, 10BASE-T is an Ethernet standard for local area networks, where "10" refers to a maximum transmission speed of 10 Mbps, "BASE" refers to baseband signaling, and "T" refers to twisted as in twisted-pair cabling. The IEEE 802.3 standard has a voltage template to specify 10BASE-T Medium Dependent Interface (MDI) signal with 100M CAT3 loss (worst-case Twisted Pair Model (TPM)). The MDI signal which is output from a 10BASE-T PHY transmitter and passes the voltage template with 100M CAT3 loss will have a serious inter-symbol interference (ISI) problem when being transmitted via a cable with a longer length (e.g., 400M or longer), which makes the 10BASE-T PHY receiver suffer from slicing errors. Most of the 10BASE-T PHY receiver designs do not have a linear equalizer or a digital front-end (e.g., a feed-forward equalizer or decision feedback equalizer) to equalize the channel ISI. Thus, there is a need for an innovative 10BASE-T PHY transmitter design which is capable of cancelling or mitigating the ISI after the MDI signal is transmitted over a long distance.

SUMMARY OF THE INVENTION

One of the objectives of the claimed invention is to provide a 10BASE-T transmitter using wave shaping for applying pre-compensation of inter-symbol interference (ISI) and an associated method.

According to a first aspect of the present invention, an exemplary 10BASE-T transmitter is disclosed. The exemplary 10BASE-T transmitter includes a Manchester encoder circuit, a waveform shaper circuit, and digital-to-analog converter (DAC) circuit. The Manchester encoder circuit is arranged to apply Manchester encoding to an input data to generate an encoded data. The waveform shaper circuit is arranged to convert the encoded data into a plurality of digital codes. The DAC circuit is arranged to generate a transmit (TX) waveform according to the plurality of digital codes. The waveform shaper circuit controls a portion of the plurality of digital codes for applying pre-compensation of inter-symbol interference (ISI) to the TX waveform.

According to a second aspect of the present invention, an exemplary 10BASE-T transmission method is disclosed. The exemplary 10BASE-T transmission method includes: applying Manchester encoding to an input data to generate an encoded data; converting the encoded data into a plurality of digital codes; and performing digital-to-analog conversion upon the plurality of digital codes to generate a transmit (TX) waveform. Converting the encoded data into the plurality of digital codes comprises: controlling a portion of the plurality of digital codes for applying pre-compensation of inter-symbol interference (ISI) to the TX waveform.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
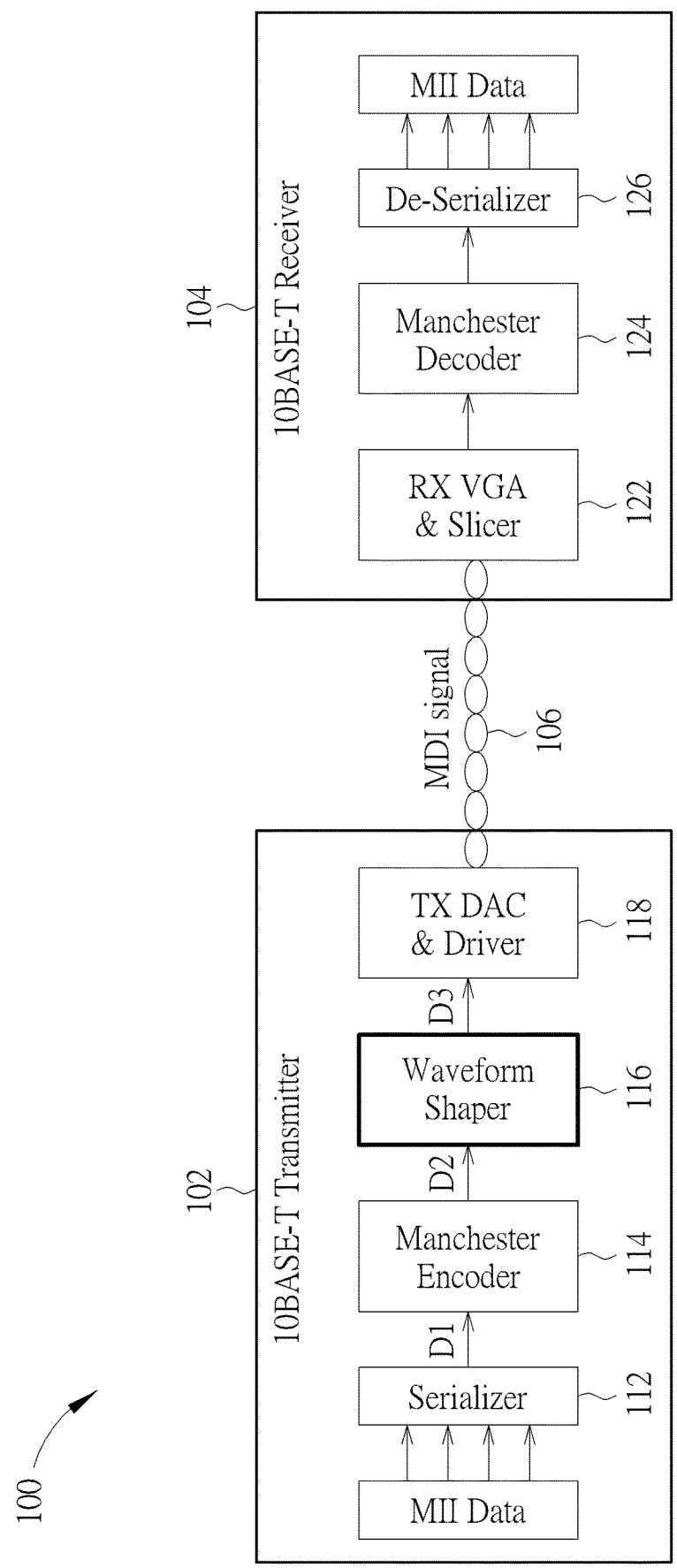
FIG. 1 is a diagram illustrating a 10BASE-T system according to an embodiment of the present invention.

FIG. 1 is a diagram illustrating a 10BASE-T system according to an embodiment of the present invention. The 10BASE-T system 100 is an Ethernet system, and includes a 10BASE-T transmitter 102 and a 10BASE-T receiver 104. A medium dependent interface (MDI) signal is transmitted from the 10BASE-T transmitter 102 to the 10BASE-T receiver 104 via a twisted-pair cable 106. The 10BASE-T transmitter 102 includes a serializer circuit (labeled by "Serializer") 112, a Manchester encoder circuit (labeled by "Manchester Encoder") 114, a waveform shaper circuit (labeled by "Waveform Shaper") 116, and a transmit (TX) digital-to-analog converter (DAC) and driver circuit (labeled by "TX DAC & Driver") 118. The 10BASE-T receiver 104 includes a receive (RX) variable gain amplifier (VGA) and slicer circuit (labeled by "RX VGA & Slicer") 122, a Manchester decoder circuit (labeled by "Manchester Decoder") 124, and a de-serializer circuit (labeled by "De-Serializer") 126. Since the present invention is focused on the design of the 10BASE-T transmitter 102, further description of the 10BASE-T receiver 104 is omitted here for brevity. It should be noted that only the components pertinent to the present invention are shown in FIG. 1. In practice, the 10BASE-T transmitter 102 may include additional components to achieve other functions.

Figure 2:
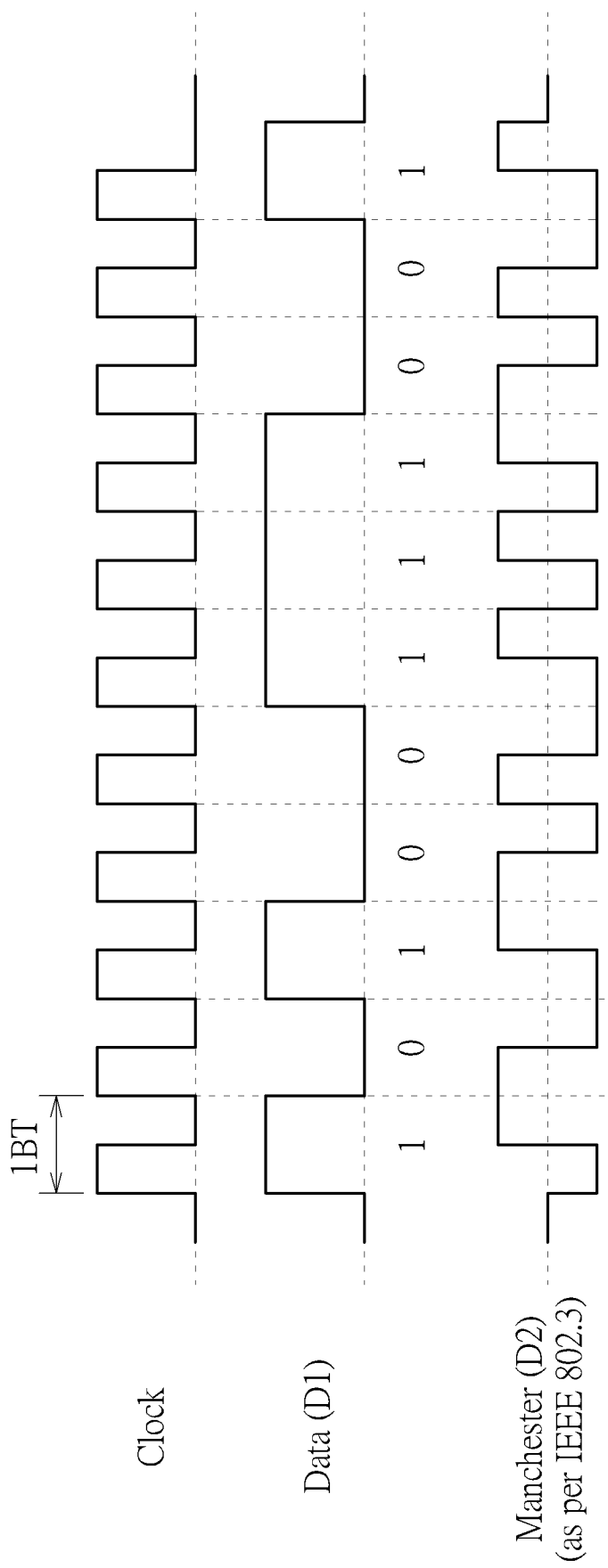
FIG. 2 is a diagram illustrating 10BASE-T Manchester encoding employed by a 10BASE-T transmitter shown in FIG. 1.

The serializer circuit 112 is arranged to receive medium independent interface (MII) data from a media access control (MAC) layer, and convert the MII data into a serial data that acts as an input data D1 of the following Manchester encoder circuit 114. The Manchester encoder circuit 114 is arranged to apply Manchester encoding to the input data D1 to generate an encoded data D2. Manchester code always has a transition at the middle of each bit time and may (depending on the information to be transmitted) have a transition at the start of the bit time. The direction of the mid-bit transition indicates the bit value. Transitions at the bit time boundaries do not carry information. They exist only to place the signal in the correct state to allow the mid-bit transition. FIG. 2 is a diagram illustrating 10BASE-T Manchester encoding employed by the 10BASE-T transmitter 102 shown in FIG. 1. One bit time (BT) is defined by a clock cycle of a clock signal used by the Manchester encoder circuit 114. As shown in FIG. 2, the input data D1 includes a plurality of consecutive bits (1, 0, 1, 0, 0, 1, 1, 1, 0, 0, 1). The Manchester encoding of the input data D1 can be done using XOR between the input data D1 and the clock signal. Hence, the encoded data D2 output from the Manchester encoder circuit 114 has a transition at the middle of each bit time, where a transition from a logic low level "0" to a logic high level "1" indicates a bit value of "1", and a transition from a logic high level "1" to a low logic level "0" indicates a bit value of "0". There are only two symbol frequencies in 10BASE-T Manchester encoding. As shown in FIG. 2, the Manchester encoding result of consecutive bits having the same bit value (e.g., all 1's or all 0's) has one symbol frequency of 10 MHz, and the Manchester encoding result of consecutive bits having alternating bit values (e.g., 01010101 . . . ) has the other symbol frequency of 5 MHz.

The waveform shaper circuit 116 is arranged to convert the encoded data D2 into a plurality of digital codes D3. The TX DAC and driver circuit 118 includes a DAC circuit arranged to generate a TX waveform according to the digital codes D3, and a driver circuit arranged to output the TX waveform to the 10BASE-T receiver 104 via the twisted-pair cable 106. If the TX waveform of the MDI signal output from the 10BASE-T transmitter 102 passes the voltage template with 100M CAT3 loss as specified by IEEE 802.3 standard, it will have a serious ISI problem when being transmitted via the twisted-pair cable 106 with a longer length (e.g., 400M or longer). To address this issue encountered by long length 10BASE-T MDI transmission, the present invention proposes using the waveform shaper circuit 116 to control a portion of the digital codes D3 for applying pre-compensation of ISI to the TX waveform of the MDI signal transmitted via the twisted-pair cable 106 with a longer length (e.g., 400M or longer).

Figure 3:
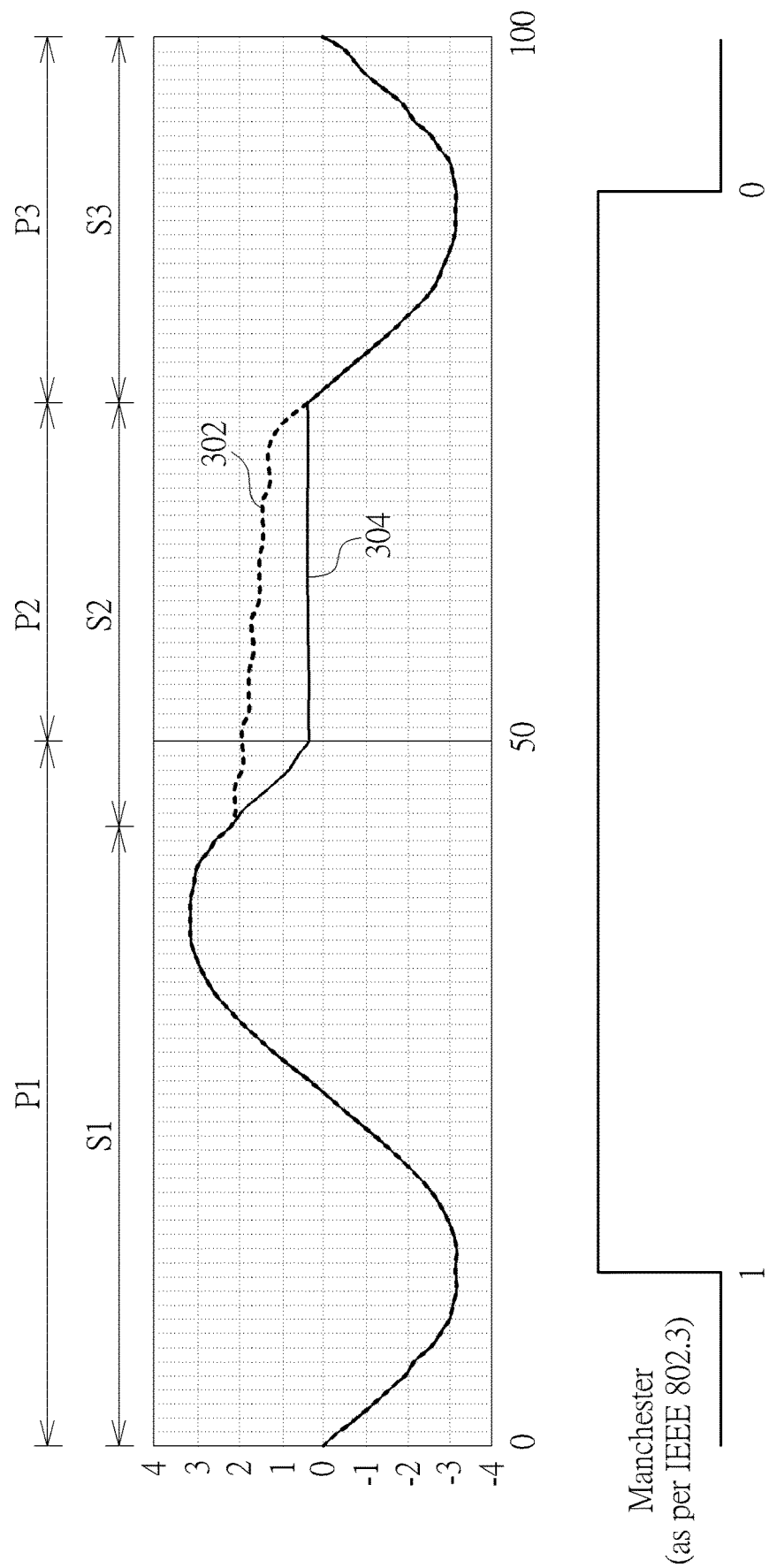
FIG. 3 is a diagram illustrating a portion of a TX waveform of an MDI signal generated for long length 10BASE-T MDI transmission according to an embodiment of the present invention.

FIG. 3 is a diagram illustrating a portion of the TX waveform of the MDI signal generated for long length 10BASE-T MDI transmission according to an embodiment of the present invention. The partial TX waveform 302 without the proposed pre-compensation of ISI is in compliance with the IEEE 802.3 standard. In contrast to the partial TX waveform 302, the partial TX waveform 304 with the proposed pre-compensation of ISI is not in compliance with the IEEE 802.3 standard. For example, the partial TX waveform 302 without the proposed pre-compensation of ISI passes the voltage template with 100M CAT3 loss as specified by IEEE 802.3 standard, while the partial TX waveform 304 with the proposed pre-compensation of ISI fails to pass the voltage template with 100M CAT3 loss as specified by IEEE 802.3 standard. Each of the partial TX waveforms 302 and 304 as shown in FIG. 3 is generated for a portion of the digital codes D3 output from the Manchester encoder circuit 114, and the portion of the digital codes D3 is generated for consecutive bits (1, 0) of the encoded data D2. The partial TX waveform 302 includes a first sinusoidal part S1, a non-sinusoidal part S2, and a second sinusoidal part S3, where the first sinusoidal part S1 is immediately followed by the non-sinusoidal part S2, and the non-sinusoidal part S2 is immediately followed by the second sinusoidal part S3. The partial TX waveform 304 includes a first sinusoidal part P1, a non-sinusoidal part P2, and a second sinusoidal part P3, where the first sinusoidal part P1 is immediately followed by the non-sinusoidal part P2, and the non-sinusoidal part P2 is immediately followed by the second sinusoidal part P3. When the 10BASE-T transmitter 102 enables the wave shaping function for applying pre-compensation of ISI to the TX waveform of the MDI signal, the waveform shaper circuit 116 controls the portion of the digital codes D3 for delaying an end time of the first sinusoidal part, and/or controls the portion of the digital codes D3 for making the non-sinusoidal part have a constant level. Compared to the first sinusoidal part S1 of the partial TX waveform 302, the first sinusoidal part P1 of the partial TX waveform 304 is extended to de-emphasize the following non-sinusoidal part. Furthermore, compared to the non-sinusoidal part S2 of the partial TX waveform 302 that has a slope shape, the non-sinusoidal part P2 of the partial TX waveform 304 is a pure flat that maximizes de-emphasis of the non-sinusoidal part. Due to de-emphasis of the non-sinusoidal part, the partial TX waveform 304 fails to pass the voltage template with 100M CAT3 loss as specified by IEEE 802.3 standard. However, de-emphasis of the non-sinusoidal part in the partial TX waveform 304 allows the non-IEEE 802.3 compliant TX waveform to emphasize the high frequency waveform (10 MHz), which pre-compensates ISI in a case of ultra long length cable (e.g., 400M or longer).

Figure 4:
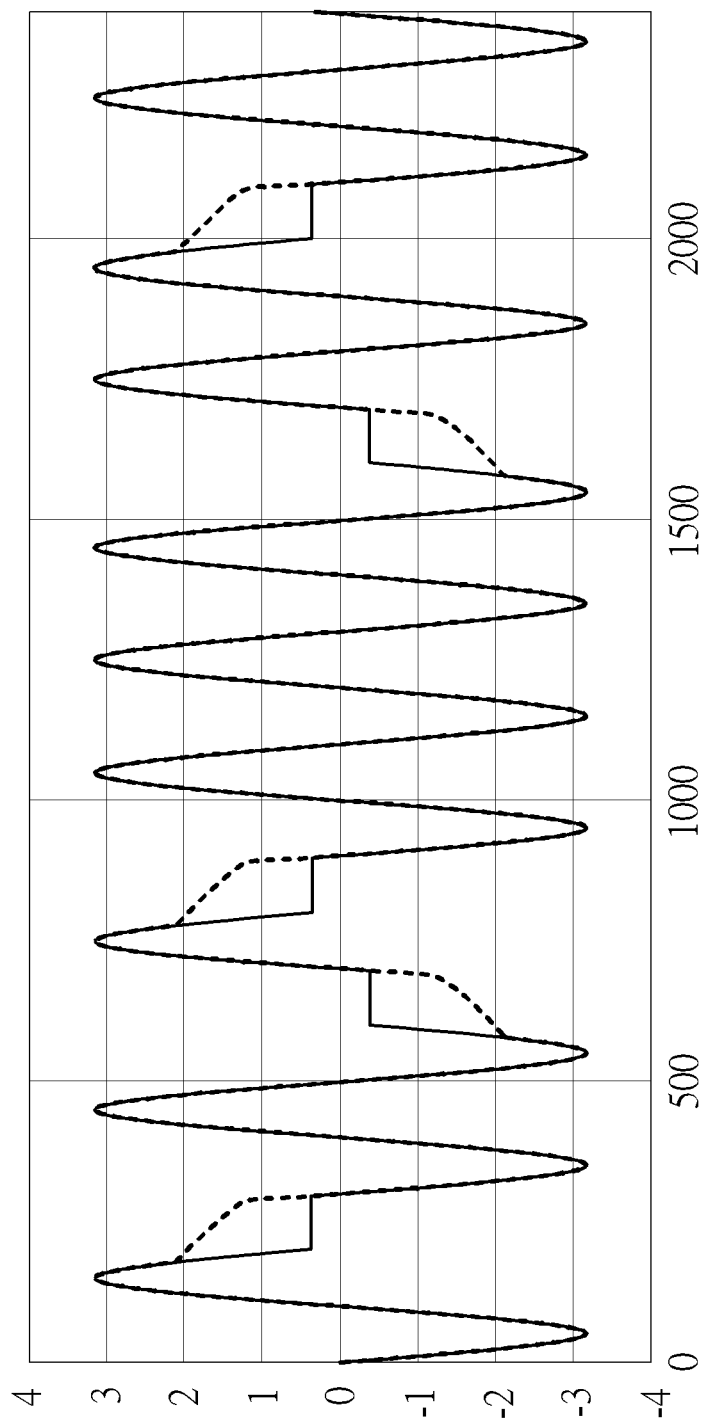
FIG. 4 is a diagram illustrating a TX waveform with pre-compensation of ISI according to an embodiment of the present invention.
Figure 5:
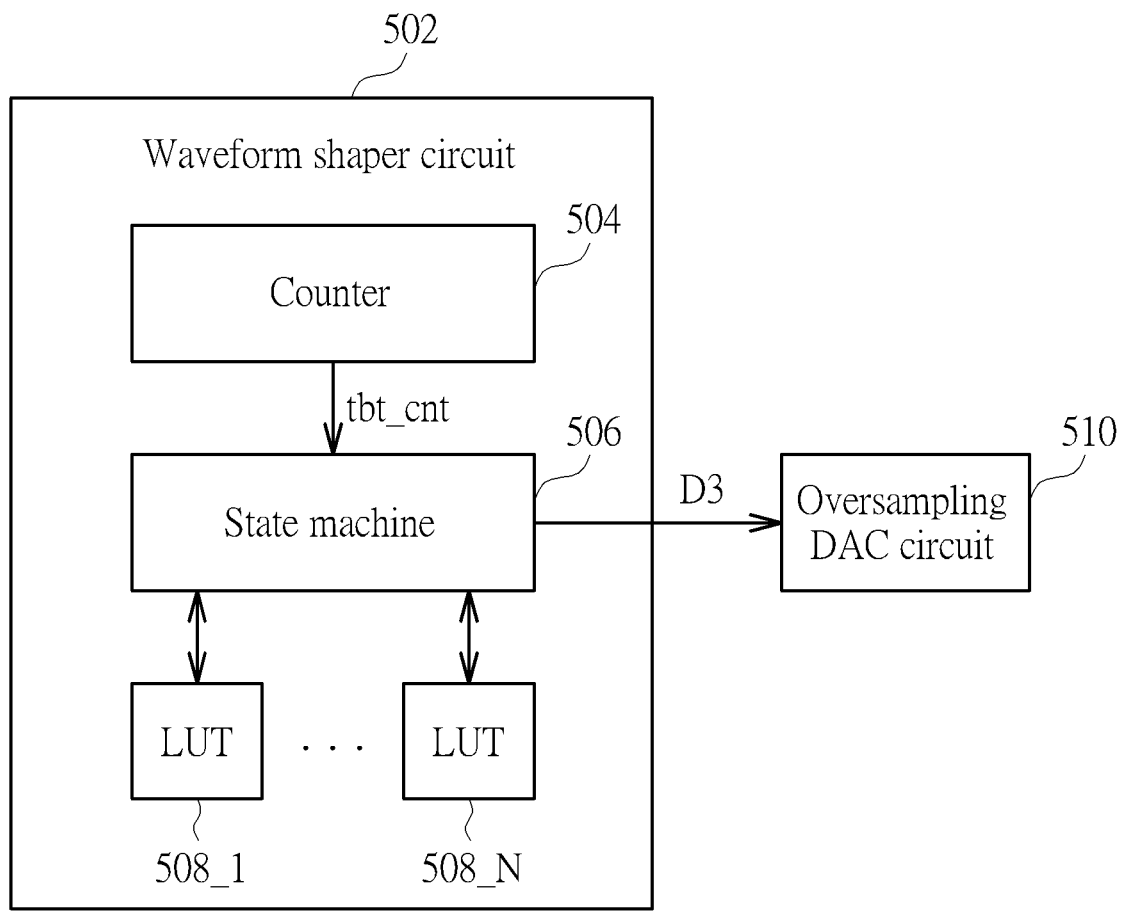
FIG. 5 is a diagram illustrating a waveform shaper circuit according to an embodiment of the present invention.

The partial TX waveform 304 as shown in FIG. 3 is generated for a portion of the digital codes D3 output from the Manchester encoder circuit 114, where the portion of the digital codes D3 is generated for consecutive bits (1, 0) of the encoded data D2. The same wave shaping concept can be applied to a partial TX waveform that is generated for a portion of the digital codes D3 output from the Manchester encoder circuit 114, where the portion of the digital codes D3 is generated for consecutive bits (0, 1) of the encoded data D2. FIG. 4 is a diagram illustrating a TX waveform with pre-compensation of ISI according to an embodiment of the present invention. Compared to the IEEE 802.3 compliant waveform with slope-shaped non-sinusoidal parts as illustrated by dotted lines, the non-IEEE 802.3 compliant waveform with delayed and de-emphasized non-sinusoidal parts (e.g., pure flat parts each following an extended sinusoidal part) as illustrated by solid lines can cancel or mitigate the ISI problem when being transmitted via the twisted-pair cable 106 with a longer length (e.g., 400M or longer).

Figure 6:
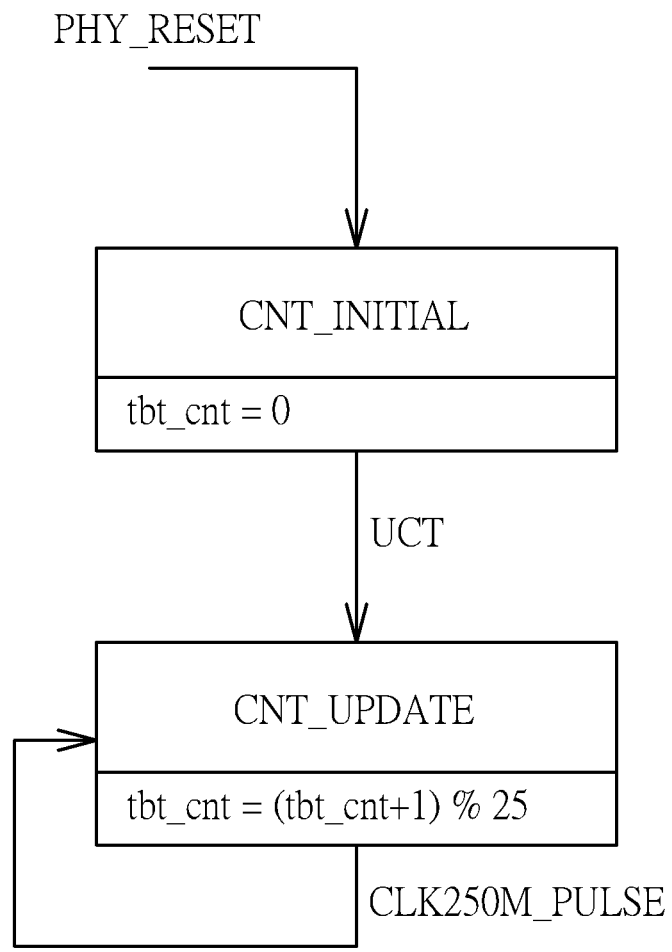
FIG. 6 is a diagram illustrating a control flow of initializing and updating a count value tbt_cnt output from a counter shown in FIG. 5 according to an embodiment of the present invention.

In some embodiments of the present invention, the DAC circuit used by the TX DAC and driver circuit 118 may be an oversampling DAC with a sampling rate faster than a data rate of the input data D1 to be transmitted, and/or the digital codes D3 fed into the oversampling DAC may be properly controlled for pre-compensation of ISI by using a state machine and a plurality of lookup tables. FIG. is a diagram illustrating a waveform shaper circuit according to an embodiment of the present invention. The waveform shaper circuit 116 shown in FIG. 1 may be implemented by the waveform shaper circuit 502, and the DAC circuit used by the TX DAC and driver circuit 118 shown in FIG. 1 may be implemented by an oversampling DAC circuit 510. For example, the oversampling DAC circuit 510 operates according to a 250 MHz oversampling clock. The waveform shaper circuit 502 includes a counter 504, a state machine 506, and a plurality of lookup tables (LUTs) 508_1-508_N (N≥2). Since the clock rate (250 MHz) of the oversampling clock CLK250M is faster than the date rate (10 MHz) of the input data D1, the counter 504 is arranged to generate and update a count value tbt_cnt indicative of every sampling time point within one bit time. FIG. 6 is a diagram illustrating a control flow of initializing and updating the count value tbt_cnt output from the counter 504 according to an embodiment of the present invention. The count value tbt_cnt is initialized by a default value (e.g., 0) when the 10-BASE-T PHY transmitter is reset. The count value tbt_cnt is updated in response to each pulse of the oversampling clock CLK250M, and is reset to the default value (e.g., 0) each time the count value tbt_cnt reaches 25.

Figure 7:
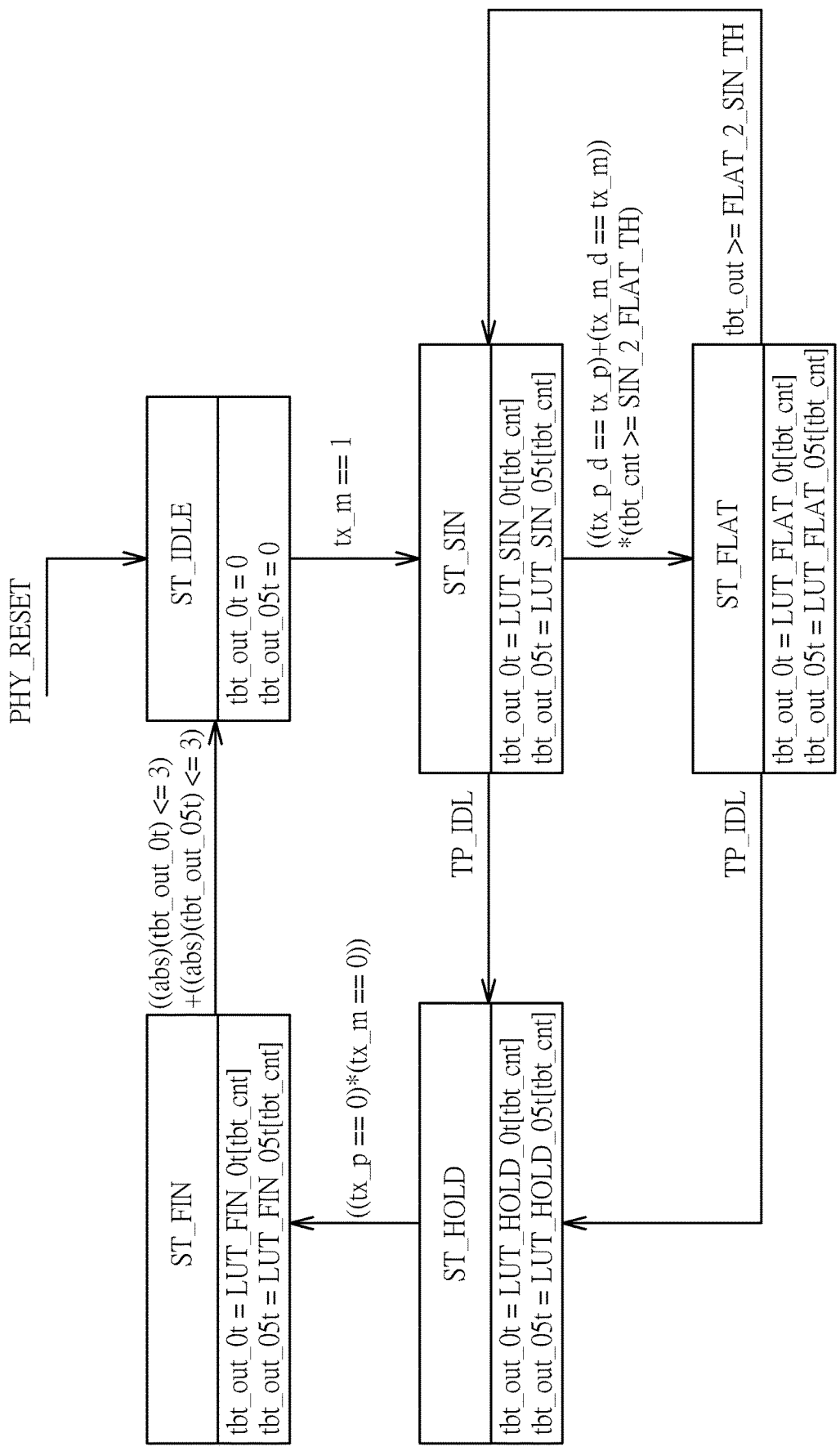
FIG. 7 is a state diagram illustrating behaviors of a state machine shown in FIG. 5 according to an embodiment of the present invention.
Figure 8:
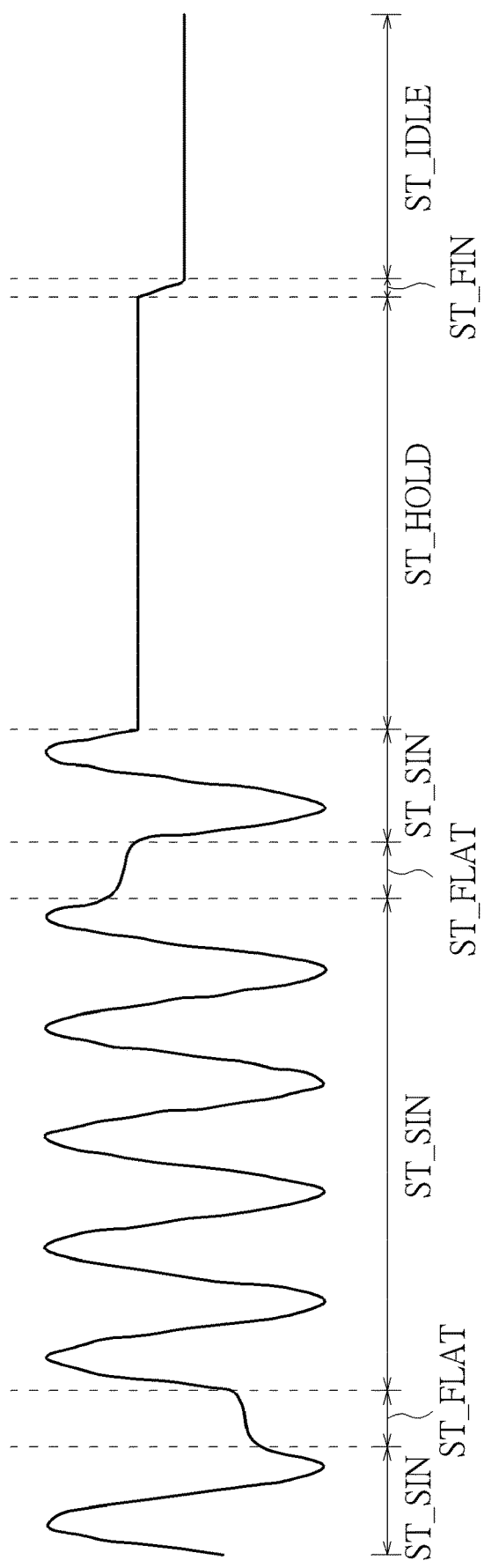
FIG. 8 is a diagram illustrating a TX waveform that is generated from an oversampling DAC circuit shown in FIG. 5 under control of the state machine shown in FIG. 5.

The state machine 506 operates according to a finite number of states. Based on the current state and a given input, the state machine 506 performs a state transition and produces an output. FIG. 7 is a state diagram illustrating behaviors of the state machine 506 according to an embodiment of the present invention. FIG. 8 is a diagram illustrating a TX waveform that is generated from the oversampling DAC circuit 510 under control of the state machine 506. In this embodiment, the state machine 506 has five states, including ST IDLE, ST SIN, ST FLAT, ST HOLD, and ST FIN, and the LUTs 508_1-508_N may include LUT_SIN_0t, LUT_SIN_0.5t, LUT_FLAT_0t, LUT_FLAT_0.5t, LUT_HOLD_0t, LUT_HOLD_0.5t, LUT_FIN_0t, and LUT_FIN_0.5t. Regarding the partial TX waveform 304 with the proposed pre-compensation of ISI, digital codes associated with each of the first sinusoidal part P1 and the second sinusoidal part P3 are set when the state machine 506 enters the ST SIN state, and digital codes associated with the non-sinusoidal part P2 is set when the state machine 506 enters the ST FLAT state. The end time of the first sinusoidal part P1 is delayed by extending the ST SIN state time. That is, the end time of the first sinusoidal part P1 is delayed through controlling the transition from the ST SIN state to the ST FLAT state. In addition, the non-sinusoidal part P2 of the partial TX waveform 304 is set by a pure flat through proper settings of the lookup table referenced at the ST FLAT state.

It should be noted that the above implementation shown in FIG. is for illustrative purposes only, and is not meant to be a limitation of the present invention. In practice, any means capable of generating a TX waveform of an MDI signal with the proposed pre-compensation of ISI (e.g., TX waveform in FIG. 4 or partial TX waveform 304 in FIG. 3, having a sinusoidal part extended to de-emphasize a following non-sinusoidal part and/or the non-sinusoidal part set by a pure flat to maximize the de-emphasis of the non-sinusoidal part) falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A 10BASE-T transmitter comprising:
a Manchester encoder circuit, arranged to apply Manchester encoding to an input data to generate an encoded data;
a waveform shaper circuit, arranged to convert the encoded data into a plurality of digital codes; and
a digital-to-analog converter (DAC) circuit, arranged to generate a transmit (TX) waveform according to the plurality of digital codes;
wherein the waveform shaper circuit controls a portion of the plurality of digital codes for applying pre-compensation of inter-symbol interference (ISI) to the TX waveform.

2. The 10BASE-T transmitter of claim 1, wherein the TX waveform is not in compliance with a voltage template specified by an IEEE 802.3 standard.

3. The 10BASE-T transmitter of claim 1, wherein the portion of the plurality of digital codes is generated for consecutive bits of the encoded data, the consecutive bits comprises a first bit and a second bit following the first bit, and the first bit and the second bit have different bit values.

4. The 10BASE-T transmitter of claim 3, wherein a portion of the TX waveform is generated for the portion of the plurality of digital codes, and comprises a sinusoidal part and a non-sinusoidal part following the sinusoidal part.

5. The 10BASE-T transmitter of claim 4, wherein the waveform shaper circuit controls the portion of the plurality of digital codes for delaying an end time of the sinusoidal part.

6. The 10BASE-T transmitter of claim 4, wherein the waveform shaper circuit controls the portion of the plurality of digital codes for making the non-sinusoidal part have a constant level.

7. The 10BASE-T transmitter of claim 3, wherein the first bit and the second bit are 0 and 1, respectively.

8. The 10BASE-T transmitter of claim 3, wherein the first bit and the 10 second bit are 1 and 0, respectively.

9. The 10BASE-T transmitter of claim 1, wherein the waveform shaper circuit comprises:
a state machine; and
a plurality of look-up tables.

10. The 10BASE-T transmitter of claim 1, wherein the DAC circuit is an oversampling DAC circuit.

11. A 10BASE-T transmission method comprising:
applying Manchester encoding to an input data to generate an encoded data;
converting the encoded data into a plurality of digital codes; and
performing digital-to-analog conversion upon the plurality of digital codes to generate a transmit (TX) waveform;
wherein converting the encoded data into the plurality of digital codes comprises:

controlling a portion of the plurality of digital codes for applying pre-compensation of inter-symbol interference (ISI) to the TX waveform.

12. The 10BASE-T transmission method of claim 11, wherein the TX waveform is not in compliance with a voltage template specified by an IEEE 802.3 standard.

13. The 10BASE-T transmission method of claim 11, wherein the portion of the plurality of digital codes is generated for consecutive bits of the encoded data, the consecutive bits comprises a first bit and a second bit following the first bit, and the first bit and the second bit have different bit values.

14. The 10BASE-T transmission method of claim 13, wherein a portion of the TX waveform is generated for the portion of the plurality of digital codes, and comprises a sinusoidal part and a non-sinusoidal part following the sinusoidal part.

15. The 10BASE-T transmission method of claim 14, wherein the portion of the plurality of digital codes is controlled for delaying an end time of the sinusoidal part.

16. The 10BASE-T transmission method of claim 14, wherein the portion of the plurality of digital codes is controlled for making the non-sinusoidal part have a constant level.

17. The 10BASE-T transmission method of claim 13, wherein the first bit and the second bit are 0 and 1, respectively.

18. The 10BASE-T transmission method of claim 13, wherein the first bit and the second bit are 1 and 0, respectively.

19. The 10BASE-T transmission method of claim 11, wherein converting the encoded data into the plurality of digital codes comprises:

using a state machine and a plurality of look-up tables.

20. The 10BASE-T transmission method of claim 11, wherein the digital-to-analog conversion is an oversampling digital-to-analog conversion.

\* \* \* \* \*